(12) United States Patent
Sun et al.

(10) Patent No.: US 9,842,177 B1
(45) Date of Patent: Dec. 12, 2017

(54) BEHAVIORAL MODELING OF JITTER DUE TO POWER SUPPLY NOISE FOR INPUT/OUTPUT BUFFERS

(71) Applicant: Cadence Design Systems, Inc., San Jose, CA (US)

(72) Inventors: Yingxin Sun, Cupertino, CA (US); Yun Dai, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 82 days.

(21) Appl. No.: 14/919,374

(22) Filed: Oct. 21, 2015

(51) Int. Cl.
*G06F 17/50* (2006.01)
(52) U.S. Cl.
CPC .................. *G06F 17/5009* (2013.01)
(58) Field of Classification Search
CPC ........................................................ G06F 17/50
USPC ......................................................... 716/115
See application file for complete search history.

(56) References Cited

U.S. PATENT DOCUMENTS

2010/0199237 A1* 8/2010 Kim .................... G06F 17/5036
716/103

* cited by examiner

*Primary Examiner* — Thuan Do
(74) *Attorney, Agent, or Firm* — Schwegman Lundberg Woessner, P.A.

(57) ABSTRACT

Aspects of the present disclosure involve a system comprising a computer-readable storage medium storing at least one program, and a method for behavioral modeling of jitters due to power supply noise for input/output (I/O) buffers. The method may include accessing physical model data describing a physical structure of an integrated circuit device, and accessing a behavioral model schema for evaluating electrical characteristics of the integrated circuit device including jitter effects introduced by power noise in the integrated circuit device. The method may further include generating behavioral model data based on the physical model data, the behavioral model data including the electrical characteristics of integrated circuit device. The method may further include providing a data file including the behavioral model data.

20 Claims, 7 Drawing Sheets

BEHAVIORAL MODELING OF JITTER DUE TO POWER SUPPLY NOISE FOR INPUT/OUTPUT BUFFERS

TECHNICAL FIELD

The subject matter disclosed herein relates to computer-aided design and analysis of electrical circuits. In particular, example embodiments relate to behavioral modeling of jitters due to power supply noise for input/output (I/O) buffers.

BACKGROUND

Traditional integrated circuit behavioral models, such as those based on the I/O buffer information specification (IBIS), describe electrical characteristics of inputs and outputs of a device without disclosing proprietary information. Typically, behavioral models are used for signal integrity analysis on a system level. However, these traditional behavioral models are not delay models for timing purposes, and thus, the syntax of these models fails to capture timing characteristics of the devices, such as power-induced jitter effects for I/O buffers. As a result, these traditional behavioral models often lead to inaccurate circuit analysis for current high-speed designs.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
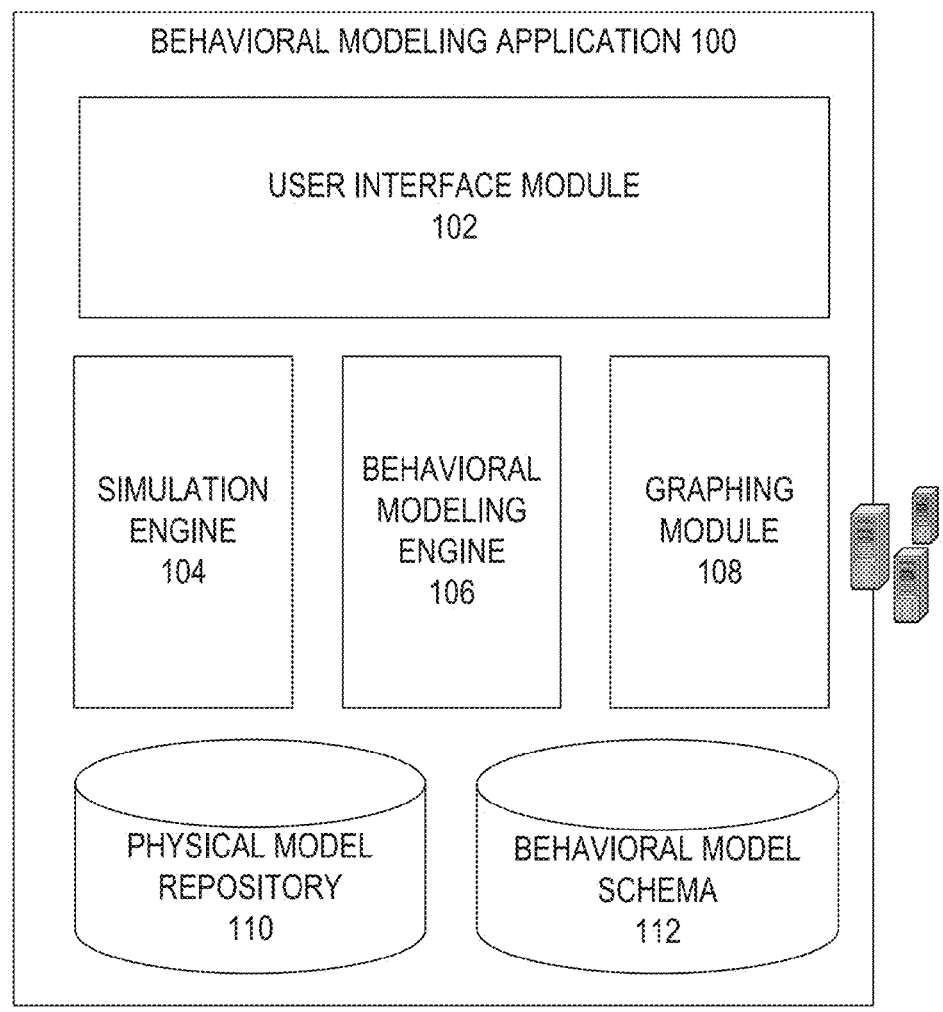
FIG. 1 is a block diagram illustrating various functional components of a behavioral modeling application, according to some example embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure involve enhanced techniques for behavioral modeling of I/O buffers that capture jitter introduced by power noise. As used herein, the term "jitter" is intended to include deviations from true periodicity of an electrical signal. Accordingly, "jitter" may be observed in the frequency, signal amplitude, and phase of such electrical signals. By taking the jitter effects of power noise into account, these enhanced techniques for behavioral modeling result in more accurate results when compared to traditional behavioral modeling techniques.

Example embodiments involve systems and methods for generating integrated circuit device behavioral models that include the jitter effects caused by power noise. While the behavioral models involved in these example embodiments may find particular application in analysis of digital inputs and outputs of devices, the present inventive subject matter is, of course, not limited to digital devices, and the behavioral models described herein could equally well find application in analysis of analog or mixed-signal devices, for example. Consistent with some embodiments, a method includes extracting multiple sets of rising and falling waveform data from a physical model of an integrated circuit device. The physical model, which may, for example, be a Simulation Program with Integrated Circuit Emphasis (SPICE) model, describes the physical structure of the device (e.g., physical elements that form the device and their connections). The rising and falling waveform data describe the voltage-time (V/T) characteristics of the device under a specified loading condition. As opposed to traditional methods, which only extract rising and falling waveform data for a single ideal input voltage condition (e.g., 1.8V for a DDR2 driver), the present method includes extracting the rising and falling waveform data from the physical model under multiple different input voltage conditions.

The method further includes performing quadratic interpolation (e.g., by 3-point curve fitting) on the multiple sets of rising and falling waveform data extracted from the physical model to produce behavioral model data that is used to compose the behavioral model. More specifically, the quadratic interpolation results in the production of pull-up and pull-down data, which collectively describe the strength of the device. The pull-up data describes the current-voltage (I/V) characteristics of the device when the device output is in a logic high state (e.g., PMOS transistor on). The pull-down data describes the direct current (DC) electrical characteristics of the device when the device output is in a logic low state (e.g., NMOS transistor on).

FIG. 1 is a block diagram illustrating various functional components of a behavioral modeling application 100, consistent with some embodiments. To avoid obscuring the inventive subject matter with unnecessary detail, various functional components (e.g., modules and engines) that are not germane to conveying an understanding of the inventive subject matter have been omitted from FIG. 1. However, a skilled artisan will readily recognize that various additional functional components may be supported by the behavioral modeling application 100 to facilitate additional functionality that is not specifically described herein.

As is understood by skilled artisans in the relevant computer arts, the modules and engines illustrated in FIG. 1 represent a set of executable software instructions and the corresponding hardware (e.g., memory and processor) for executing the instructions. Furthermore, the various functional components depicted in FIG. 1 may reside on a single computer (e.g., a laptop), or may be distributed across several computers in various arrangements such as cloud-based architectures. Moreover, it shall be appreciated that while the functional components (e.g., modules and engines) of FIG. 1 are discussed in the singular sense, in other embodiments, multiple instances of one or more of the modules may be employed.

As illustrated in FIG. 1, the behavioral modeling application 100 includes a user interface module 102, a simulation engine 104, a behavioral modeling engine 106, and a graphing module 108, all configured to be in communication with each other (e.g., via a bus, a shared memory, a network, or a switch) so as to allow information to be passed between the functional components or so as to allow the functional components to share and access common data.

As shown, the behavioral modeling application 100 is generally based on three-layer software architecture, consisting of a front-end layer, a logic layer, and a data layer, although the inventive subject matter is by no means limited to such architecture. The presentation layer consists of the user interface module 102, which is responsible for presenting information and handling user interactions related to the functions of the behavioral modeling application 100. Accordingly, the user interface module 102 may provide a number of interfaces to users (e.g., interfaces that are presented on a computing system operated by the user) that allow the users to create, view, and validate behavioral models. To this end, the interfaces provided by the user interface module 102 include graphical interface elements (e.g., buttons, toggles, switches, drop-down menus, or sliders) that may be manipulated through user input to perform various operations associated with behavioral modeling of integrated circuit devices. For example, the user interface module 102 may provide an interface element that allows users to view information included in behavioral models and view graphical representations of behavioral model data. The user interface module 102 also receives and processes user input received through such interface elements.

The application layer of the behavioral modeling application 100 includes the simulation engine 104, the behavioral modeling engine 106, and the graphing module 108. The simulation engine 104 is configured to run simulations of physical models (e.g., SPICE models) of integrated circuit devices. The simulation engine 104 is configured to run simulations of the physical models to collect data related to electrical characteristics of the devices. More specifically, the simulation engine 104 is configured to obtain rising and falling waveform data associated with I/O buffers included in the devices. The rising and falling waveform data obtained through simulation of physical models includes I/V data, which describes I/V characteristics of the device, and V/T data, which describes V/T characteristics of the device. The simulation engine 104 may access data files representing the physical models from a physical model repository 110 or from a local or network location specified by a user.

The behavioral modeling engine 106 is configured to generate behavioral models (e.g., IBIS models) of integrated circuit devices. The behavioral modeling engine 106 generates behavioral models of devices based on the data (e.g., rising and falling waveform data) obtained by the simulation engine 104 through simulations of the physical models of the devices. In generating behavioral models, the behavioral modeling engine 106 access a behavioral model schema 112 that includes a set of equations for evaluating the electrical characteristics of a device. The behavioral model schema 112 also includes one or more terms for determining the jitter introduced by power noise so that the electrical characteristics determined by evaluating the set of equations include the power-induced jitter effects.

Figure 2:
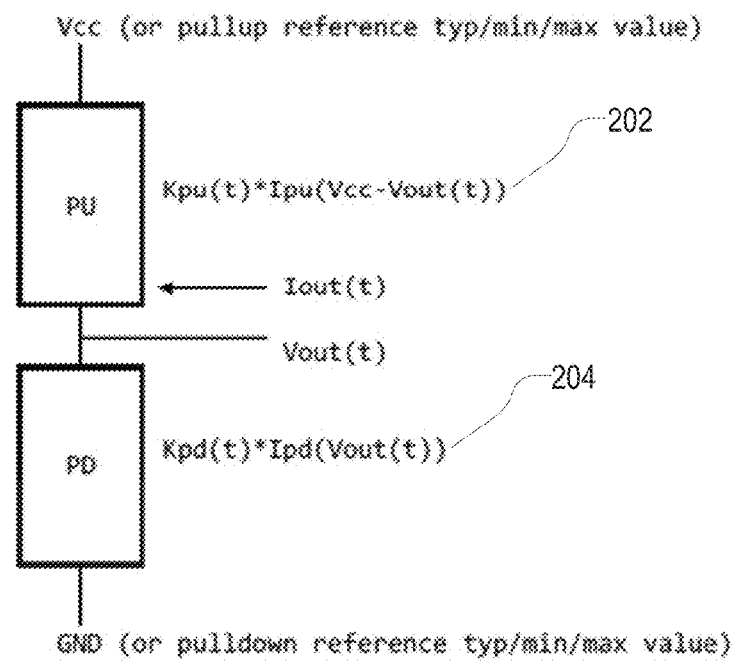
FIG. 2 is a symbolic representation of an I/O buffer behavioral model, according to some example embodiments.

As an example of the forgoing, FIG. 2 is a symbolic representation of a portion of a behavioral modeling schema 200, according to some example embodiments. As shown, the behavioral modeling schema 200 includes an expression 202 corresponding to the pull-up (PU) behavior of the I/O buffer, and an expression 204 corresponding to the pull-down (PD) behavior of the I/O buffer.

In conventional analysis, Kpu(t) and Kpd(t) for rising and falling waveforms of a device are found simply by using rising waveform data and falling waveform data extracted from a physical model under ideal input voltage (illustrated in FIG. 2 as "Vcc") conditions to solve the following equations: (1) Kpu(t)*Ipu(Vcc−Vout(t))+Iout(t)=Kpd(t)*Ipd(Vout(t)); and (2) Iout(t)=(V_fixture−Vout(t))/R_fixture−C_comp*dVout(t)/dt. In contrast, in accordance with the behavioral modeling schema 200, rising and falling waveform data is extracted from the physical model (e.g., through simulation performed by the simulation engine 104) under different input voltage (Vcc) conditions, which may include ideal and non-ideal voltage conditions. The behavioral modeling engine 106 then uses quadratic interpolation (e.g., by 3-point curve fitting) to determine Kpu(t, Vcc−Vout(t)) and Kpd(t, Vout(t)), in accordance with the behavioral modeling schema 200. For example, Kpu(t) and Kpd(t) may be represented in the behavioral modeling schema 200 as follows:

$$Kpu(t)=Kpu0(t)+Bpu(t)*(Vcc(t)-Vcc0)+Apu(t)*(Vcc(t)-Vcc0)^2$$

$$Kpd(t)=Kpd0(t)+Bpd(t)*(Vcc(t)-Vcc0)+Apd(t)*(Vcc(t)-Vcc0)^2$$

In the above equations, Vcc(t) is the nominal power supply voltage; Vcc0 is the actual power supply voltage; Kpu(t) is the conductive coefficient of the pull up device at time t during buffer switching; Kpd(t) is the conductive coefficient of the pull down device at time t during buffer switching; Kpu0(t) is the conductive coefficient of the pull up device when Vcc(t)=Vcc0; Kpd0(t) is the conductive coefficient of the pull down device when Vcc(t)=Vcc0; Bpu(t) and Bpd(t) are correction coefficients of the linear term; and Apu(t) and Apd(t) are correction coefficients of the square term.

Referring back to FIG. 1, the behavioral models generated by the behavioral modeling engine 106 comprise behavioral model data that describes electrical characteristics of devices. For example, the behavioral model data includes information describing the non-linear behavior of pull-up, pull-down, and clamps, which are described in I/V data tables and modeled as voltage controlled current sources. The behavioral model data further includes information describing the transition behavior of the devices, which is described in a V/T table and used to derive and scale the instantaneous values of the data included in the I/V data tables, and other information describing important parasitic elements of the devices.

The graphing module 108 is configured to generate graphical representations (e.g., two-dimensional graphs) of behavioral model data to illustrate electrical characteristics of devices. In generating graphical representations of behavioral model data, the graphing module 108 plots various data points included therein, and connects the plot points using various known curve-sketching techniques. The graphical representations generated by the graphing module 108 may, for example, represent pull-up and pull-down curves, power and ground clamp curves, ramp rates, and rising and falling waveforms, among others.

The data layer of the behavioral modeling application 100 resides on one or more tangible machine-readable storage units, which may be local (e.g., a hard drive) or network-based (e.g., cloud storage). The data layer includes the physical model repository 110 comprising a plurality of existing physical models and the behavioral model schema 112 for evaluating electrical characteristics of devices. Each of the models included in the physical model repository 110 comprises structured data that represent one or more real-world electrical components (e.g., resistors, capacitors, transistors, or the like).

Figure 3:
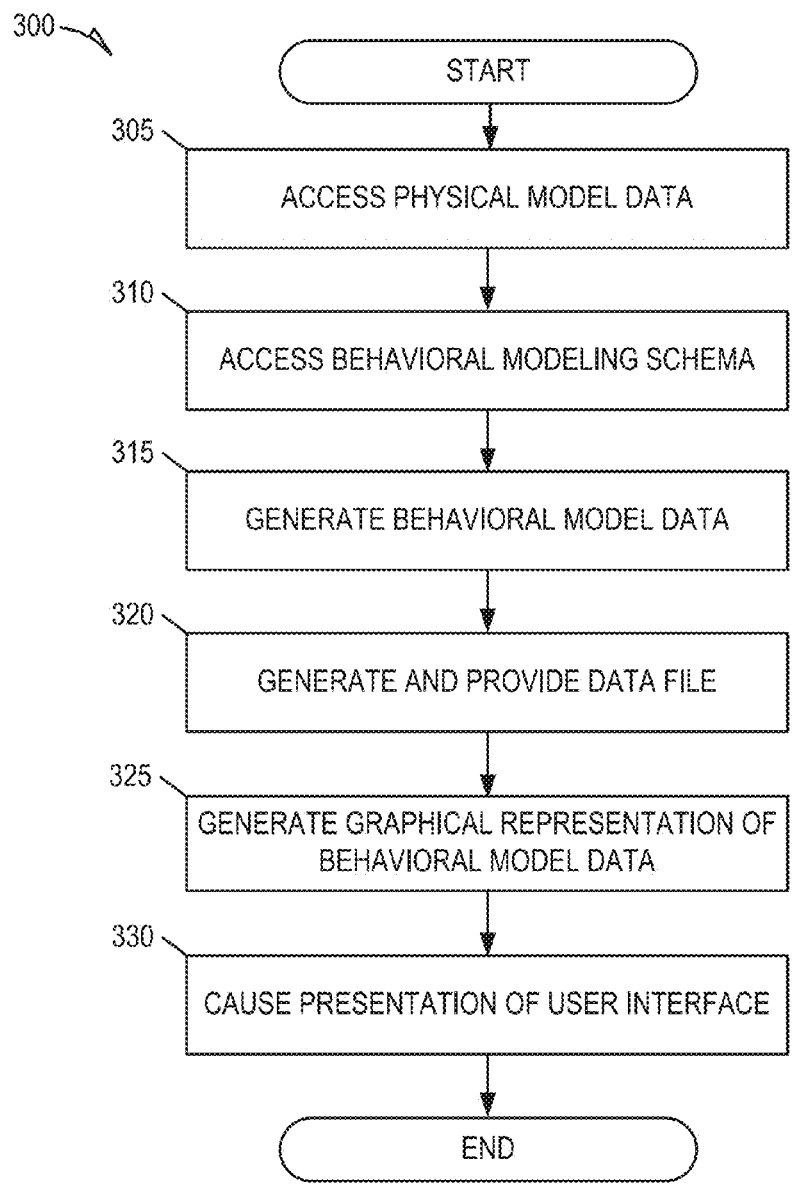
FIG. 3 is a flow chart illustrating a method for generating and providing an I/O buffer behavioral model that includes power-induced jitter effects, according to some example embodiments.

FIG. 3 is a flow chart illustrating a method 300 for generating and providing an I/O buffer behavioral model that includes power-induced jitter effects, according to some example embodiments. The method 300 may be embodied in computer-readable instructions for execution by a hardware component (e.g., a processor) such that the operations of the method 300 may be performed by a specially configured machine. In particular, the operations of the method 300 may be performed in part or in whole by the functional components forming the behavioral modeling application 100, and accordingly, the method 300 is described below by way of example with reference thereto. However, it shall be appreciated that the method 300 may be deployed on various other hardware configurations and is not intended to be limited to the behavioral modeling application 100.

At operation 305, the behavioral modeling engine 106 accesses physical model data corresponding to a physical model (e.g., a SPICE model) of a device. The physical model describes the physical elements (e.g., transistors) and structure (e.g., connections between physical elements) of the device. The behavioral modeling engine 106 may access physical model data corresponding to a user-specified physical model from a user-specified location (e.g., within a machine-readable storage unit), which may, in some embodiments, correspond to the physical model repository 110.

At operation 310, the behavioral modeling engine 106 accesses a behavioral modeling schema (e.g., behavioral modeling schema 112) for evaluating electrical characteristics of a device. The behavioral modeling schema may be stored in and accessed from a machine-readable storage unit. The behavioral modeling schema includes a set of equations for evaluating the electrical characteristics. The equations included in the behavioral modeling schema include one or more terms for determining power-induced jitter associated with the device so as to enable greater accuracy in the determination of the electrical characteristics. Accordingly, the electrical characteristics determined through evaluation of the set of equations factor in the jitter effects introduced by power noise.

At operation 315, the behavioral modeling engine 106 uses the behavioral modeling schema and data extracted from the physical model to generate behavioral model data describing electrical characteristics of the device. Because the behavioral modeling schema includes one or more terms for determining the power-induced jitter, the electrical characteristics determined by the behavioral modeling engine 106 include the jitter effects introduced by power noise. The behavioral model data includes a first set of data corresponding to an I/V curve (I/V data), which describes the relationship between current and voltage in the device, and a second set of data corresponding to a V/T curve (V/T data), which describes the relationship between voltage and time in the device. Further details of operations included in operation 315 are discussed below in reference to FIG. 5, according to some example embodiments.

At operation 320, the behavioral modeling engine 106 generates and provides a data file that includes the behavioral model data. Those skilled in the art will appreciate that the data file may, itself, be considered a behavioral model of the device. The data file includes data tables corresponding to the first and second sets of data discussed above. A user may open the data file using a computer application such as a word processing program (e.g., Microsoft Word®) or text editor to view the behavioral model data in human-readable text (e.g., ASCII text).

In some embodiments, the data file may be generated in accordance with a standard behavioral modeling specification such as IBIS. Accordingly, the data file may be generated in a parsable file format with a particular syntax that includes rules for allowable characters, line length, and the like. Moreover, in some embodiments, the data file generated by the behavioral modeling engine 106 at operation 320 is an IBIS data file.

At operation 325, which is optional in some embodiments, the graphing module 108 generates a graphical representation of the behavioral model data. The graphical representation of the behavioral model data may, for example, include a two-dimensional graph of the I/V curve or the V/T curve. The graphing module 108 may generate the graphical representation in response to a user request for such entered through a GUI provided by the user interface module 102, and the particular portion of the behavioral model data that is graphically represented (e.g., the I/V curve or the V/T curve) depends on user selection.

Figure 4:
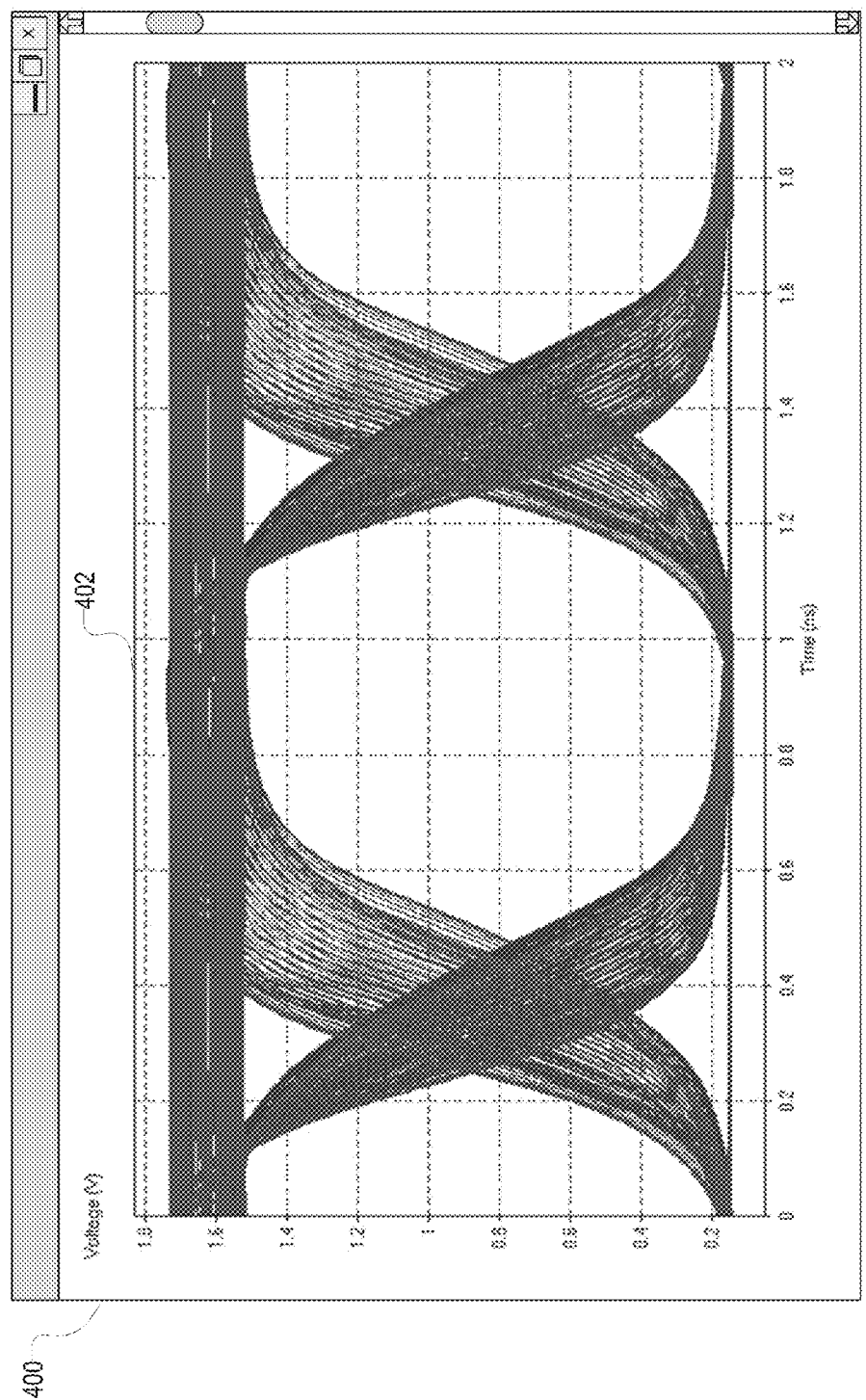
FIG. 4 is an interface diagram illustrating a graphical representation of behavioral model data, according to some example embodiments.

At operation 330, which is also optional in some embodiments, the user interface module 102 causes presentation of a user interface on a display of a computing device. The user interface includes the graphical representation generated by the graphing module 108 at operation 325. As an example, FIG. 4 is an interface diagram illustrating an interface 400 including a graphical representation of behavioral model data of a device, according to some example embodiments. As shown, the interface 400 includes a graph 402 of a portion of the behavioral model data that is included in a behavioral model. More specifically, the graph 402 includes a set of curves connecting respective sets of data values that represent electrical characteristics of the device. In the graph 402, the vertical axis, or the Y-axis, represents voltage, and the horizontal axis, or the X-axis, represents time. Accordingly, the graph 402 represents the V/T behavior of the device.

Figure 5:
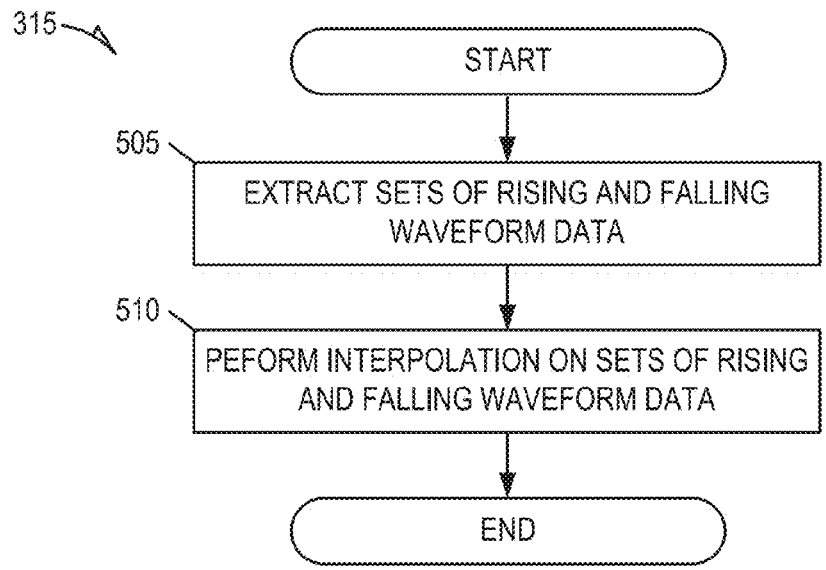
FIG. 5 is a flow chart illustrating a method for generating behavioral model data, which is included in the behavioral model, according to some example embodiments.

FIG. 5 is a flow chart illustrating a method 315 for generating behavioral model data, which is included in the behavioral model, according to some example embodiments. The method 315 may be embodied in computer-readable instructions for execution by a hardware component (e.g., a processor) such that the operations of the method 315 may be performed by a specially configured machine. In particular, the operations of the method 320 may be performed in part or in whole by the functional components forming the behavioral modeling application 100, and accordingly, the method 315 is described below by way of example with reference thereto. However, it shall be appreciated that the method 320 may be deployed on various other hardware configurations and is not intended to be limited to the behavioral modeling application 100.

At operation 505, the simulation engine 104 extracts multiple sets of rising and falling waveform data (e.g., data describing the voltage-time (V/T) characteristics of a device under specified loading conditions) from a physical model (e.g., a SPICE model) of a device. Each set of rising and falling waveform data extracted from the physical model corresponds to a different input voltage condition. Accordingly, the simulation engine 104 extracts the multiple sets of rising and falling waveform data by performing multiple simulations of the physical model under the different input voltage conditions. Further details of the operation 505 are presented below in reference to FIG. 6, according to some example embodiments.

At operation 510, the behavioral modeling engine 106 performs quadratic interpolation on the sets of rising and falling waveform data extracted from the physical model to produce behavioral model data that includes the jitter effects introduced by power noise. The behavioral model data produced as a result of the quadratic interpolation includes data that describes the pull-up and pull-down behavior of the device. In some embodiments, the behavioral modeling engine 106 may perform the quadratic interpolation on the sets of rising and falling waveform data by applying 3-point curve fitting techniques. As an example, in performing the quadratic interpolation, the behavioral modeling engine 106 uses the data extracted from the physical model (e.g., the rising and falling waveform data) to solve the following equations, which are included in the behavioral modeling schema:

$$Kpu(t)=Kpu0(t)+Bpu(t)*(Vcc(t)-Vcc0)+Apu(t)*(Vcc(t)-Vcc0)2$$

$$Kpd(t)=Kpd0(t)+Bpd(t)*(Vcc(t)-Vcc0)+Apd(t)*(Vcc(t)-Vcc0)2$$

To further the example provided above, the following example pseudocode represents a set of operations that may be performed by the behavioral modeling engine 106 in producing the behavioral model data.

```
a1 = IpuH[0][0] - IpuL[0][0];
a2 = IpuH[1][0] - IpuL[1][0];
b1 = IpdH[0][0] - IpdL[0][0];
b2 = IpdH[1][0] - IpdL[1][0];
c1 = Ipad[0][0] - IpuL[0][0] + IpdH[0][0];
c2 = Ipad[1][0] - IpuL[1][0] + IpdH[1][0];
tmp = a1 *b2 - a2*b1;
alpha = (c1 *b2 - c2*b1) / tmp;
beta = (c2*a1 - c1 *a2) / tmp;
if(deltaVcc<0)
{
  pJitterModel->alpha1[h1] = alpha;
  pJitterModel->beta1[h1] = beta;
}
else if(deltaVcc>0)
{
  pJitterModel->alpha2[h1] = alpha;
  pJitterModel->beta2[h1] = beta;
}
else
{
   if(analyze_case==ConstantStuff::TYP_CASE)
   {
     alpha_typ[h1]= alpha;
     beta_typ[h1]= beta;
   }
   else if(analyze_case==ConstantStuff::MIN_CASE)
   {
     alpha_min[h1] = alpha;
     beta_min[h1] = beta;
   }
   else
   {
     alpha_max[h1] = alpha;
     beta_max[h1] = beta;
   }
}
```

Figure 6:
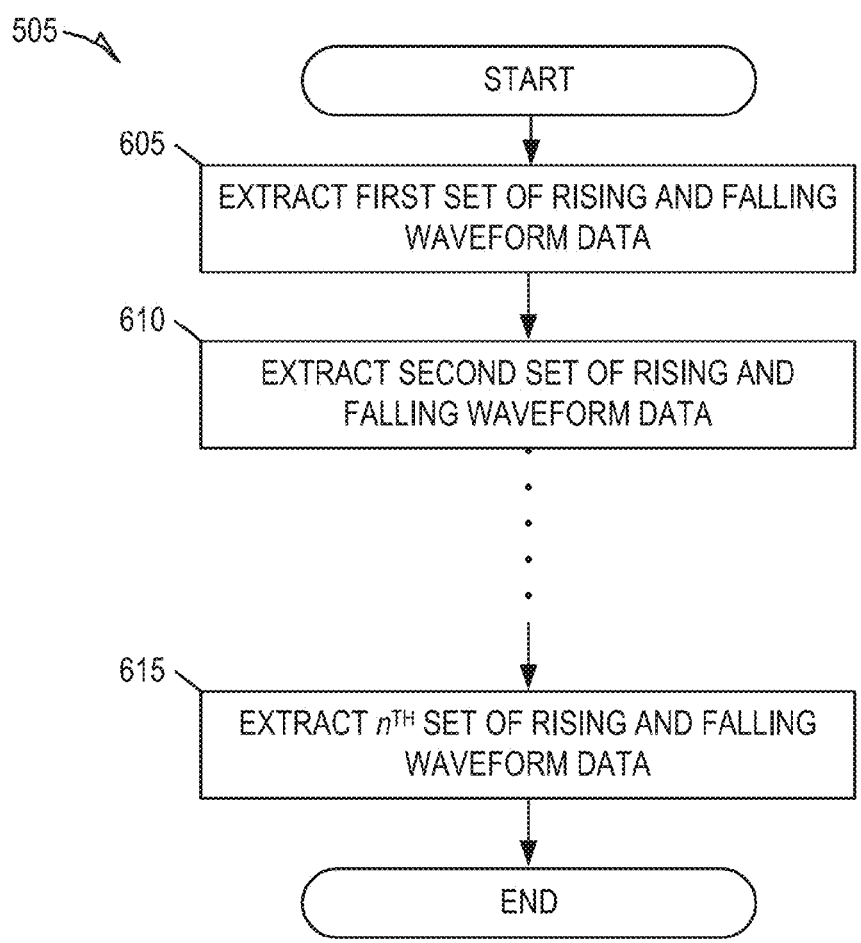
FIG. 6 is a flow chart illustrating a method for extracting sets of rising and falling waveform data, according to some example embodiments.

FIG. 6 is a flow chart illustrating a method 505 for extracting sets of rising and falling waveform data, according to some example embodiments. The method 505 may be embodied in computer-readable instructions for execution by a hardware component (e.g., a processor) such that the operations of the method 505 may be performed by a specially configured machine. In particular, the operations of the method 505 may be performed in part or in whole by the functional components forming the behavioral modeling application 100, and accordingly, the method 505 is described below by way of example with reference thereto. However, it shall be appreciated that the method 505 may be deployed on various other hardware configurations and is not intended to be limited to the behavioral modeling application 100.

At operation 605, the simulation engine 104 extracts a first set of rising and falling waveform data from the physical model corresponding to a first input voltage value. The simulation engine 104 extracts the first set of rising and falling waveform data by performing a simulation of the physical model using the first input voltage value. For example, for a DDR2 driver, the simulation engine 104 performs a first simulation of the physical model of the DDR2 driver using an input voltage value of 1.7 V.

At operation 610, the simulation engine 104 extracts a second set of rising and falling waveform data from the physical model corresponding to a second input voltage value. Following the example of the DDR2 driver from above, the simulation engine 104 performs a second simulation of the physical model of the DDR2 driver using an input voltage value of 1.8V.

At operation 615, the simulation engine 104 extracts an nth set of rising and falling waveform data from the physical model corresponding to an nth input voltage value. In other words, in the method 505, the simulation engine 104 repeats the process of extracting a set of rising and falling waveform data from the physical model (e.g., by performing a number of simulations of the physical model), with each set of rising and falling waveform data corresponding to a different input voltage value. In FIG. 6, the number of times the process is repeated is represented by "n". The number of times the extraction is repeated, or "n," may be based on a default value established during the development of the behavioral modeling application 100, or based on a value specified by a user using a GUI provided by the user interface module 102. Following the above example of the DDR2 driver, if n is three, then, at operation 615, the simulation engine 104 performs a third simulation of the physical model of the DDR2 driver using an input voltage value of 1.9V.

Figure 7:
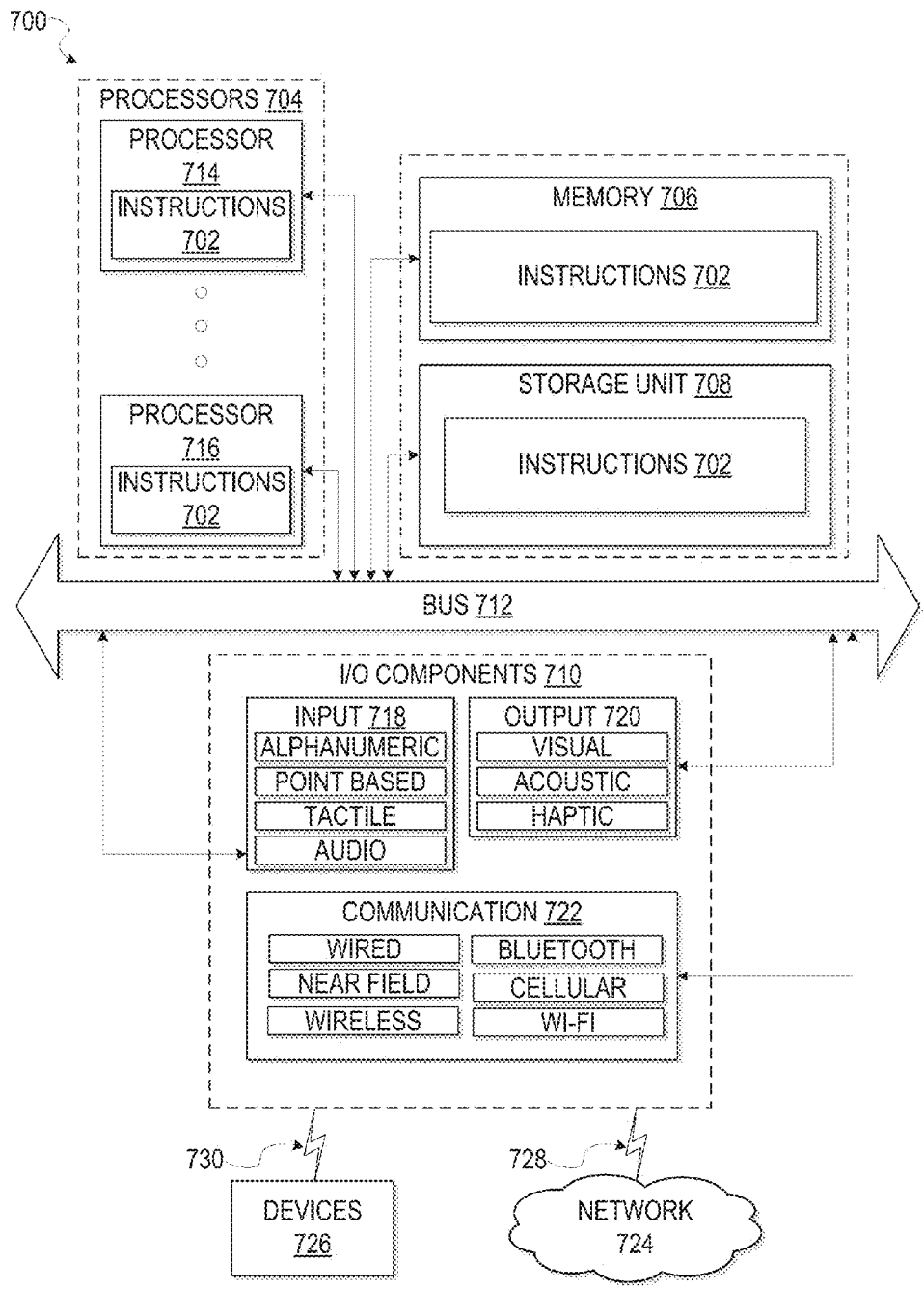
FIG. 7 is a diagrammatic representation of a machine in the example form of a computer system within which a set of instructions for causing the machine to perform any one or more of the methodologies discussed herein may be executed.

FIG. 7 is a block diagram illustrating components of a machine 700, according to some example embodiments, able to read instructions from a machine-readable medium (e.g., a machine-readable storage medium) and perform any one or more of the methodologies discussed herein. Specifically, FIG. 7 shows a diagrammatic representation of the machine 700 in the example form of a system, within which instructions 702 (e.g., software, a program, an application, an applet, an app, a driver, or other executable code) for causing the machine 700 to perform any one or more of the methodologies discussed herein may be executed. For example, the instructions 702 include executable code that causes the machine 700 to execute the methods 300, 320, and 505. In this way, these instructions 702 transform the general, non-programmed machine 700 into a particular machine programmed to carry out the described and illustrated functions of the behavioral modeling application 100 in the manner described herein. The machine 700 may operate as a standalone device or may be coupled (e.g., networked) to other machines.

By way of non-limiting example, the machine 700 may comprise or correspond to a television, a computer (e.g., a server computer, a client computer, a personal computer (PC), a tablet computer, a laptop computer, or a netbook), a set-top box (STB), a personal digital assistant (PDA), an entertainment media system (e.g., an audio/video receiver), a cellular telephone, a smart phone, a mobile device, a wearable device (e.g., a smart watch), a portable media player, or any machine capable of executing the instructions 702, sequentially or otherwise, that specify actions to be taken by the machine 700. Further, while only a single machine 700 is illustrated, the term "machine" shall also be taken to include a collection of machines 700 that individually or jointly execute the instructions 702 to perform any one or more of the methodologies discussed herein.

The machine 700 may include processors 704, memory 706, storage unit 708, and I/O components 710, which may be configured to communicate with each other such as via a bus 712. In an example embodiment, the processors 704 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 714 and a processor 716 that may execute the instructions 702. The term "processor" is intended to include multi-core processors 704 that may comprise two or more independent processors (sometimes referred to as "cores") that may execute instructions contemporaneously. Although FIG. 7 shows multiple processors, the machine 700 may include a single processor with a single core, a single processor with multiple cores (e.g., a multi-core processor), multiple processors with a single core, multiple processors with multiple cores, or any combination thereof.

The memory 706 (e.g., a main memory or other memory storage) and the storage unit 708 are both accessible to the processors 704 such as via the bus 712. The memory 706 and the storage unit 708 store the instructions 702 embodying any one or more of the methodologies or functions described herein. The storage unit 708 is also configured to include the physical model repository 110 and the behavioral model schema 112. The instructions 702 may also reside, completely or partially, within the memory 706, within the storage unit 708, within at least one of the processors 704 (e.g., within the processor's cache memory), or any suitable combination thereof, during execution thereof by the machine 700. Accordingly, the memory 706, the storage unit 708, and the memory of the processors 704 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 702. The term "machine-readable medium" shall also be taken to include any medium, or combination of multiple media, that is capable of storing instructions (e.g., instructions 702) for execution by a machine (e.g., machine 700), such that the instructions 702, when executed by one or more processors of the machine 700 (e.g., processors 704), cause the machine 700 to perform any one or more of the methodologies described herein (e.g., method 300, 320, and 505). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 710 may include a wide variety of components to receive input, provide output, produce output, transmit information, exchange information, capture measurements, and so on. The specific I/O components 710 that are included in a particular machine 700 will depend on the type of the machine 700. For example, portable machines such as mobile phones will likely include a touch input device or other such input mechanisms, while a headless server machine will likely not include such a touch input device. It will be appreciated that the I/O components 710 may include many other components that are not specifically shown in FIG. 7. The I/O components 710 are grouped according to functionality merely for simplifying the following discussion and the grouping is in no way limiting. In various example embodiments, the I/O components 710 may include input components 718 and output components 720. The input components 718 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 720 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 710 may include communication components 722 operable to couple the machine 700 to a network 724 or devices 726 via a coupling 728 and a coupling 730 respectively. For example, the communication components 722 may include a network interface component or another suitable device to interface with the network 724. In further examples, the communication components 722 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 726 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network 724 (e.g., the Internet) and via one or more appropriate interfaces (e.g., APIs).

Electronic Apparatus and System

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A method comprising:
   accessing physical model data including a physical model of an integrated circuit device, the physical model data describing a physical structure of the integrated circuit device;
   accessing, from a memory storage unit, a behavioral model schema that includes a set of expressions for evaluating electrical characteristics of inputs and outputs of the integrated circuit device, the at least one expression of the set of expressions including one or more terms related to jitter effects introduced by power noise in the integrated circuit device;
   generating, using the behavioral model schema, behavioral model data based on the physical model data, the behavioral model data including the electrical characteristics of the inputs and outputs of the integrated circuit device, the electrical characteristics of the integrated circuit device including the jitter effects introduced by the power noise, the generating of the behavioral model data being performed by at least one processor of a machine, the generating of the behavioral model comprising:
      extracting multiple sets of rising and falling waveform data from the physical model data, each set of rising and falling waveform data corresponding to a different input voltage condition, and
      generating data associated with pull-up and pull-down behavior of the integrated circuit device based on the multiple sets of rising and falling waveform data; and
   providing a data file including the behavioral model data.

2. The method of claim 1, further comprising:
   generating a graphical representation of the electrical characteristics of the inputs and outputs of the integrated circuit device; and
   causing presentation of a user interface that includes the graphical representation of the electrical characteristics of the inputs and outputs of the integrated circuit device.

3. The method of claim 1, wherein the generating of the data associated with the pull-up and pull-down behavior of the integrated circuit device includes:
   performing quadratic interpolation on the plurality of sets of rising and falling waveform.

4. The method of claim 1, wherein the extracting of the multiple sets of rising and falling waveform data from the physical model data includes performing simulations of the physical model under a plurality of input voltage conditions.

5. The method of claim 1, wherein the electrical characteristics of the inputs and outputs of the integrated circuit device include voltage-time (V/T) and current-voltage (I/V) characteristics of the integrated circuit device.

6. The method of claim 5, wherein the data file includes V/T data and I/V data, the V/T data corresponding to the V/T characteristics, the I/V data corresponding to the I/V characteristics.

7. The method of claim 1, wherein the set of expressions include expressions for evaluating the pull-up and pull-down behavior of the integrated circuit device.

8. The method of claim 1, wherein the data file is in a parsable data file format.

9. The method of claim 1, wherein the data file is generated in accordance with Input/output Buffer Information Specification (IBIS).

10. The method of claim 1, wherein the physical model is a Simulation Program with Integrated Circuit Emphasis (SPICE) model.

11. The method of claim 1, wherein the data file is generated in accordance with Input/output Buffer Information Specification (IBIS).

12. The method of claim 1, wherein the physical model is a Simulation Program with Integrated Circuit Emphasis (SPICE) model.

13. A system comprising:
at least one processor of a machine; and
a non-transitory machine-readable storage medium embodying instructions that, when executed by at least one processor of a machine, cause the machine to perform operations comprising:
accessing physical model data including a physical model of an integrated circuit device, the physical model data describing a physical structure of the integrated circuit device;
accessing, from a memory storage unit, a behavioral model schema that includes a set of expressions for evaluating electrical characteristics of inputs and outputs of the integrated circuit device, at least one expression of the set of expressions including one or more terms related to jitter effects introduced by power noise in the integrated circuit device;
generating, using the behavioral model schema, behavioral model data based on the physical model data, the behavioral model data including the electrical characteristics of the inputs and outputs of the integrated circuit device, the electrical characteristics of the integrated circuit device including the jitter effects introduced by the power noise, the generating of the behavioral model comprising:
extracting multiple sets of rising and falling waveform data from the physical model data, each set of rising and falling waveform data corresponding to a different input voltage condition, and
generating data associated with pull-up and pull-down behavior of the integrated circuit device based on the multiple sets of rising and falling waveform data; and
providing a data file including the behavioral model data.

14. The system of claim 13, wherein operations further comprise:
generating a graphical representation of the electrical characteristics of the inputs and outputs of the integrated circuit device; and
causing presentation of a user interface that includes the graphical representation of the electrical characteristics of the inputs and outputs of the integrated circuit device.

15. The system of claim 13, wherein the generating of the data associated with the pull-up and pull-down behavior of the device includes:
performing quadratic interpolation on the plurality of sets of rising and falling waveform data.

16. The system of claim 13, wherein the extracting of the multiple sets of rising and falling waveform data from the physical model data includes performing simulations of the physical model under a plurality of input voltage conditions.

17. The system of claim 13, wherein the electrical characteristics of the inputs and outputs of the integrated circuit device include voltage-time (V/T) and current-voltage (I/V) characteristics of the integrated circuit device.

18. The system of claim 17, wherein the data file includes V/T data and I/V data, the V/T data corresponding to the V/T characteristics, the I/V data corresponding to the I/V characteristics.

19. The system of claim 13, wherein the set of expressions include expressions for evaluating the pull-up and pull-down behavior of the integrated circuit device.

20. A non-transitory machine-readable storage medium comprising instructions that, when executed by one or more processors of a machine, cause the machine to perform operations comprising:
accessing physical model data including a physical model of an integrated circuit device, the physical model data describing a physical structure of the integrated circuit device;
accessing, from a memory storage unit, a behavioral model schema that includes a set of expressions for evaluating electrical characteristics of inputs and outputs of the integrated circuit device, at least one expression of the set of expressions including one or more terms related to jitter effects introduced by power noise in the integrated circuit device;
generating, using the behavioral model schema, behavioral model data based on the physical model data, the behavioral model data including the electrical characteristics of the inputs and outputs of the integrated circuit device, the electrical characteristics of the integrated circuit device including the jitter effects introduced by the power noise, the generating of the behavioral model comprising:
extracting multiple sets of rising and falling waveform data from the physical model data, each set of rising and falling waveform data corresponding to a different input voltage condition, and
generating data associated with pull-up and pull-down behavior of the integrated circuit device based on the multiple sets of rising and falling waveform data;
providing a data file including the behavioral model data.

* * * * *